(12) United States Patent
Bazarsky et al.

(10) Patent No.: US 10,222,990 B2
(45) Date of Patent: Mar. 5, 2019

(54) OPTIMISTIC READ OPERATION

(71) Applicant: SanDisk Technologies Inc., Plano, TX (US)

(72) Inventors: Alexander Bazarsky, Holon (IL); Grishma Shah, Milpitas, CA (US); Idan Alrod, Herzliya (IL); Eran Sharon, Rishon Lezion (IL)

(73) Assignee: SanDisk Technologies LLC, Plano, TX (US)

( * ) Notice: Subject to any disclaimer, the term of this patent is extended or adjusted under 35 U.S.C. 154(b) by 351 days.

(21) Appl. No.: 14/808,435

(22) Filed: Jul. 24, 2015

(65) Prior Publication Data

US 2017/0024127 A1 Jan. 26, 2017

(51) Int. Cl.
*G06F 3/06* (2006.01)
*G11C 29/52* (2006.01)
*G06F 11/10* (2006.01)
*G11C 29/04* (2006.01)

(52) U.S. Cl.
CPC ............ *G06F 3/061* (2013.01); *G06F 3/0659* (2013.01); *G06F 3/0679* (2013.01); *G06F 11/1068* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 8,094,500 B2 * | 1/2012 | Paley | G06F 12/0246 365/185.11 |
| 9,436,615 B2 * | 9/2016 | Gorobets | G06F 12/1009 |
| 2013/0182483 A1 | 7/2013 | Zhang | |
| 2014/0244878 A1 | 8/2014 | Miller | |
| 2015/0095563 A1 * | 4/2015 | Royer, Jr. | G06F 3/06 711/105 |
| 2016/0364289 A1 * | 12/2016 | Beattie | G06F 3/0619 |
| 2017/0131925 A1 * | 5/2017 | Kim | G06F 3/0608 |
| 2017/0242787 A1 * | 8/2017 | Shen | G06F 12/0246 |

* cited by examiner

*Primary Examiner* — Justin R Knapp
(74) *Attorney, Agent, or Firm* — Dickinson Wright PLLC

(57) ABSTRACT

A non-volatile memory system may include a non-volatile memory die storing a requested data set that a host requests to be read. In response to the host request, a copy of a data set may be retrieved from the non-volatile memory die without performing error correction on an entry identifying a physical address where the data set is stored. If the data set copy matches the requested data set, the data set copy may be sent to the host. If the data set copy does not match the requested data set, then error correction may be performed on a copy of the entry to identify the correct physical address where the requested data set is stored. A copy of the requested data set may then be retrieved and sent to the host.

20 Claims, 11 Drawing Sheets

OPTIMISTIC READ OPERATION

BACKGROUND

A non-volatile memory system may receive a host read request from a host that requests the non-volatile memory system to read a data set. Upon receipt of the host read request, the non-volatile memory system may determine a physical address that identifies where in a non-volatile memory array of the non-volatile memory system the data set is stored. The host read request may identify the data set by identifying a logical address in the host read request. A controller of the non-volatile memory system may be configured to translate the logical address to the physical address by maintaining a directory system that maps logical addresses to physical addresses. The directory system itself may be stored in the non-volatile memory array along with other data that the host has requested to be stored. When the host read request is received, if the controller needs to access the directory system in the non-volatile memory array to obtain a mapping of the logical address and physical address, the controller may need to determine where in the non-volatile memory array the mapping is stored, retrieve the mapping, and perform error correction on the mapping before the controller retrieves the data set from the non-volatile memory array. Such actions consume time and other read operations with improved read efficiency may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF THE PRESENTLY PREFERRED EMBODIMENTS

Overview

Figure 1A:
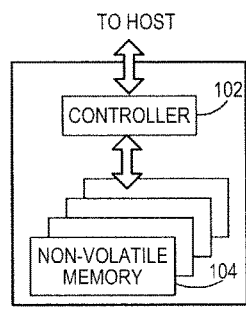
FIG. 1A is a block diagram of an exemplary non-volatile memory system.

Embodiments of the present invention are defined by the claims, and nothing in this section should be taken as a limitation on those claims.

By way of introduction, the following embodiments describe non-volatile memory systems and related methods of performing read operations in a non-volatile memory system. In one embodiment, a non-volatile memory system may include a non-volatile memory die comprising a non-volatile memory array; and a controller. The controller may include a front end module configured to receive a host read request to read a requested data set. The controller may further include a sequencer module configured to receive a first physical address of an entry stored in the non-volatile memory array. The entry may include a second physical address that identifies where in the non-volatile memory array the requested data set is stored. Upon receipt of the first physical address, the sequencer module may further be configured to generate and issue, to the non-volatile memory die via a memory interface, a first command to have the non-volatile memory die perform a sense operation on the entry and a second command to have the non-volatile memory die return a copy of a data set to the controller.

In a second embodiment, a non-volatile memory system may include a controller and a non-volatile memory die. The non-volatile memory die may include a non-volatile memory array, a memory interface in communication with the controller, a sensing control module, and a physical address identification module. The memory interface may be configured to receive a command from the controller to perform a sensing operation on a target entry stored in the non-volatile memory array at a first physical address. The target entry may include a second physical address that identifies where in the non-volatile memory array a data set is stored. The sensing control module may be configured to sense a copy of the target entry into a data cache in response to receipt of the command. The physical address identification module may be configured to identify the second physical address from the target entry copy and provide the second physical address to the sensing control module. The sensing control module may further be configured to sense a copy of the data set into the data cache in response to receipt of the second physical address from the physical address identification module, and the memory interface may be configured to transfer the data set copy to the controller.

In a third embodiment, a method of executing a read operation in a non-volatile memory system may be performed. The method may include receiving, with a front end module, a host read request to read a requested data set. The host read request may identify a logical address associated with the requested data set. In addition, the method may include performing, with a sensing control module of a non-volatile memory die, a first sensing operation on an entry stored in a non-volatile memory array of the non-volatile memory die. The entry may map the logical address identified in the host read request to a physical address. The method may also include performing, with the sensing control module, a second sensing operation on a data set stored in the non-volatile memory array at the physical address identified in the entry without first performing error correction on a copy of the entry. The method may further include verifying, with a verification module, that a copy of the data set generated in response to the second sensing operation matches the requested data set before the front end module transfers the data set copy to the host.

In some embodiments, a cache checking module may determine whether the entry is stored in an external memory that is external to the non-volatile memory die before the sequencer module generates and issues the first command.

In some embodiments, a verification module may verify that the data set copy matches the requested data set prior to transfer of the data set copy to a host after the data set copy is returned to the controller.

In some embodiments, an entry extraction module may extract a target entry copy from a copy of a group of entries, and provide the target entry copy to a physical address identification module located on the non-volatile memory die.

In some embodiments, a logical address included in the host read request may be compared with a logical address included in the data set copy stored in an external memory to verify that the data set copy matches the requested data set.

In some embodiments, error correction may be performed on a copy of the entry when the data set copy does not match the requested data set.

In some embodiments, a sequencer module may send a column address offset to the non-volatile memory die, where the column address offset identifies the requested data set among a plurality of data sets.

Other embodiments are possible, and each of the embodiments can be used alone or together in combination. Accordingly, various embodiments will now be described with reference to the attached drawings.

Exemplary Embodiments

The following embodiments describe non-volatile memory systems and related methods of performing read operations in a non-volatile memory system. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s)s 104, even if a single channel is shown in the drawings.

Figure 1B:
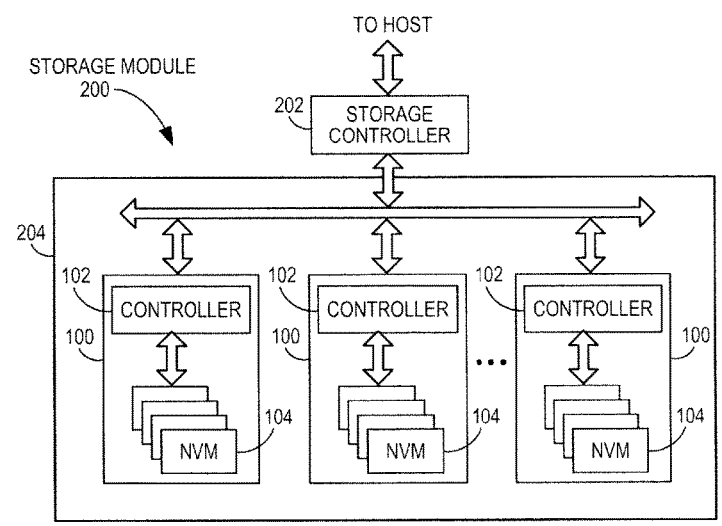
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
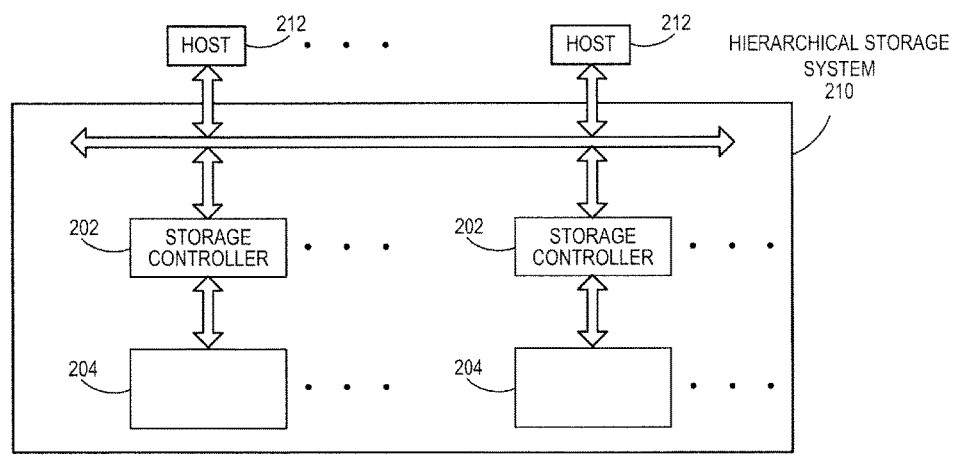
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
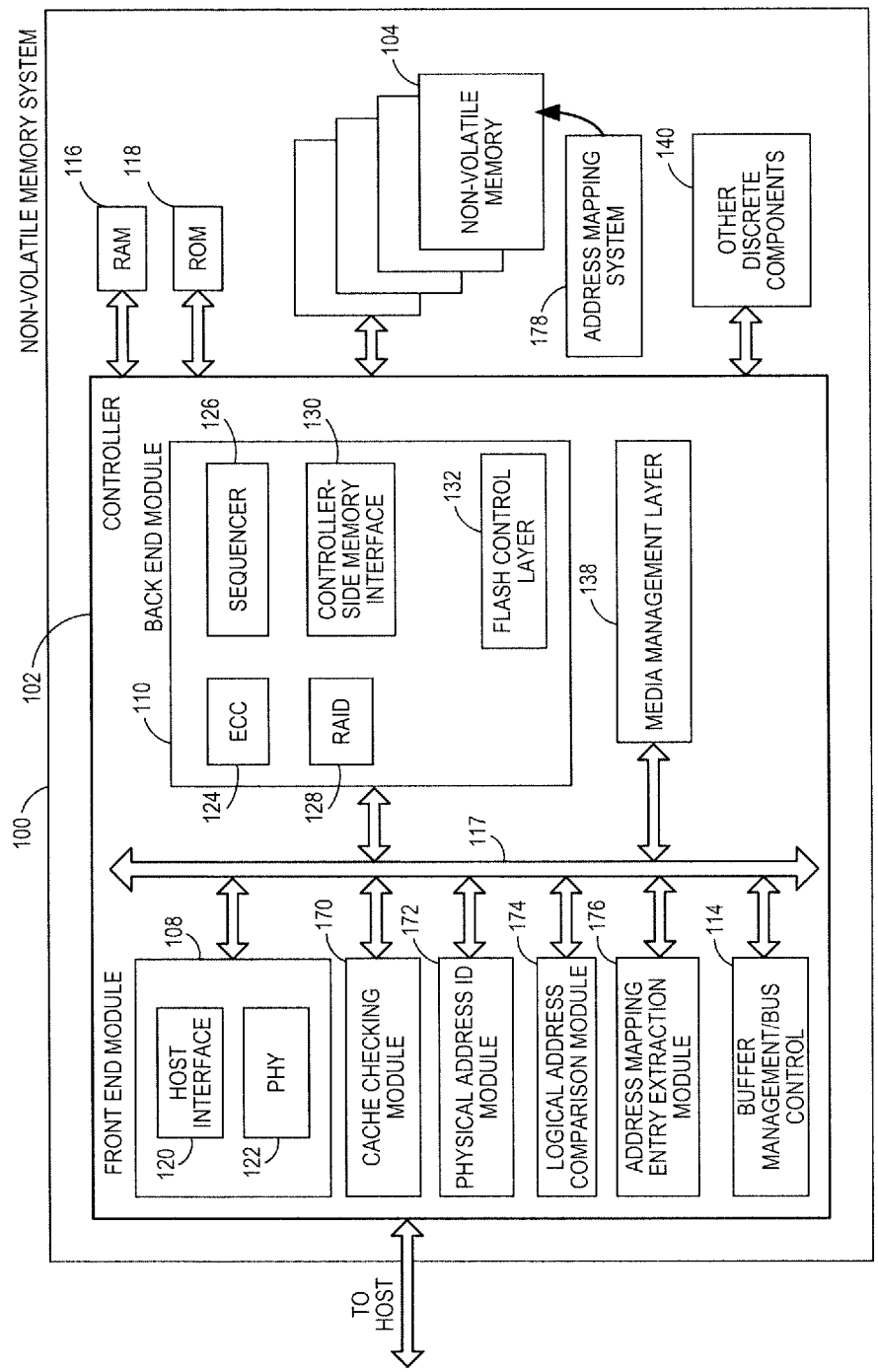
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A controller-side interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the controller-side memory interface 130. In one embodiment, the controller-side memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Additional modules of the non-volatile memory system 100 illustrated in FIG. 2A may also include a cache checking module 170, a physical address identification module 172, a logical address comparison module 174, and an address mapping entry extraction module 176, as described in further detail below. These modules are shown as separate from the other modules of the non-volatile memory system 100, although in other configurations, one or more of them may be part of any of the other modules.

Figure 2B:
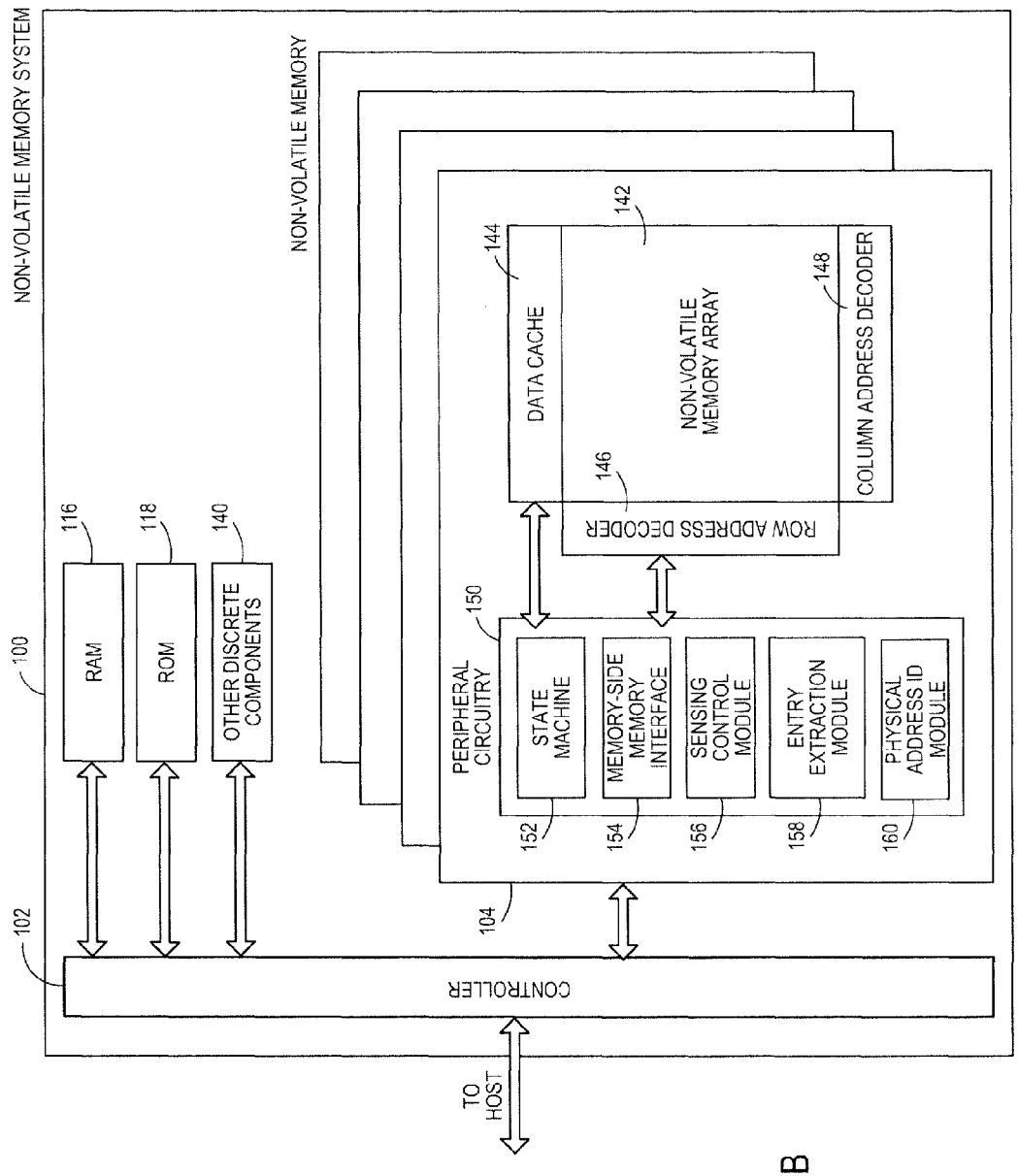
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
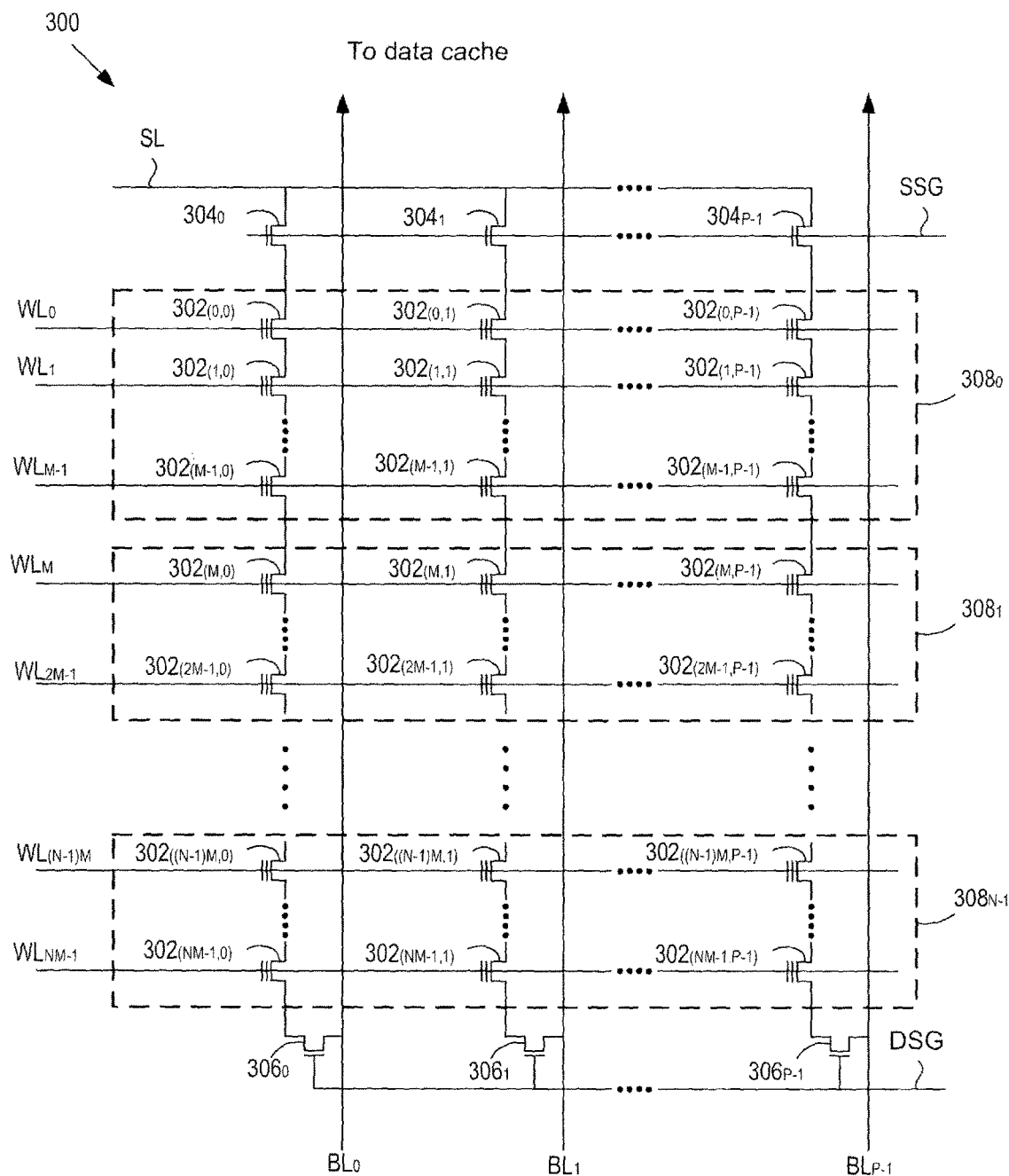
FIG. 3 is a circuit schematic diagram of an exemplary NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, ..., $304_{P-1}$ may be controlled using a source select gate bias line SSG that supplies a source select gate bias voltage $V_{SSG}$ to turn on an off the source select transistors $304_0$, $304_1$, ..., $304_{P-1}$. Additionally, switching of drain select transistors $306_0$, $306_1$, ..., $306_{P-1}$ may be controlled using a drain select gate bias line DSG that supplies a drain select gate bias voltage $V_{DSG}$ to turn on and off the drain select transistors $306_0$, $306_1$, ..., $306_{P-1}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102. In addition, the peripheral circuitry 150 may include a memory-side memory interface 154 that interfaces and/or communicates with the host-side memory interface 130. The peripheral circuitry 150 may also include a sensing control module 156 that controls performance of sensing operations, and in particular the row and column address decoders 146, 148 in order to have desired or determined data sensed from the memory array 142 into the data cache 144. In addition, the peripheral circuitry 150 may include an address mapping entry extraction module 158 and a physical address identification module 160. Further details of these modules is described below.

Figure 4:
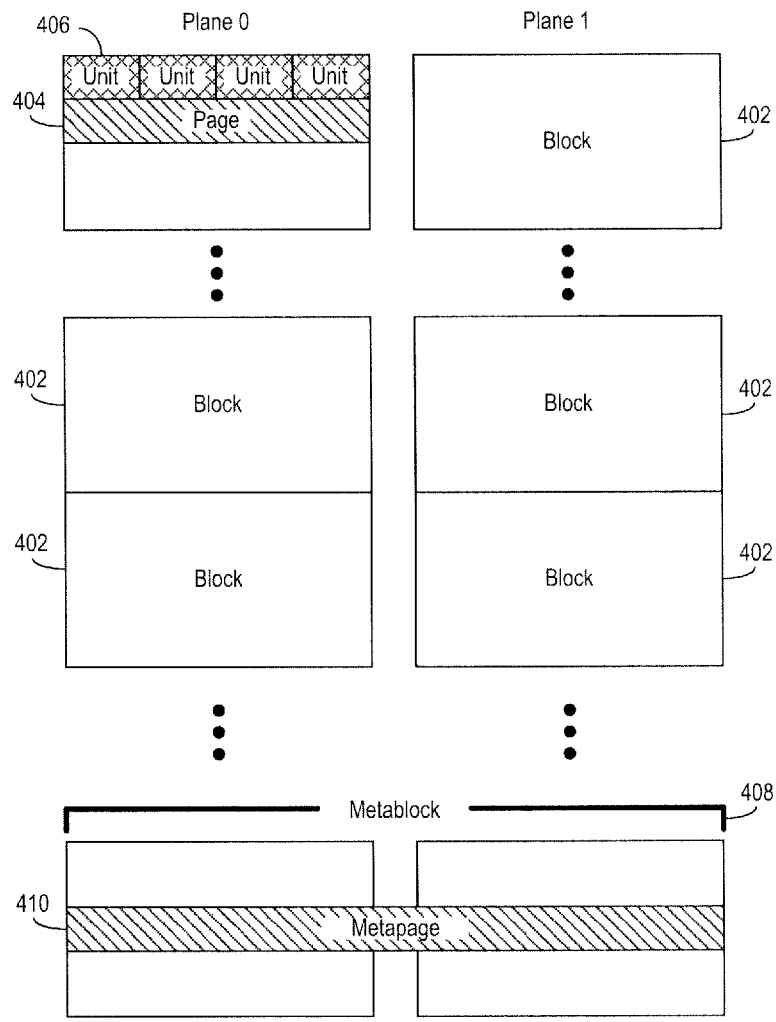
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402, although other configurations may be possible. A single memory array 142 may include a single plane or multiple planes. The example arrangement shown in FIG. 4 includes two planes, Plane 0 and Plane 1. Data stored in different planes may be sensed simultaneously or independently.

Additionally, the organizational arrangement or hierarchy may include metablocks 408 and metapages 410. A metablock address or number identifying a metablock may be mapped to and/or correspond to a host or logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

In addition, some example configurations of the non-volatile memory system 100 may include a single memory die 104, while other example configurations may include a plurality of memory dies 104. Further, for some example multi-die configurations, the multiple memory dies 104 may be configured into a single chip enable group, while for other example multi-die configuration, the multiple memory dies 104 may be configured into multiple chip enable groups. If the controller 102 wants a particular memory die 104 to process a command that the controller 102 wants to send to it, the controller 102 may be configured to send a chip enable signal to that memory die 102 in order to enable it. Upon being enabled by the chip enable signal, the memory die 104 may be ready and able to receive and process requests or commands, such as read, write, erase, and status commands, received from the controller 102. Conversely, if a memory die 104 is not enabled in response to a chip enable signal, then the memory die 104 may not be able to receive and handle commands or requests sent from the controller 102. Memory dies 104 of the same chip enable group may be configured to receive and/or be enabled by the same chip enable signal sent from the controller 102. Conversely, memory dies 104 that are not configured in that chip enable group may be configured not to receive and/or not be enabled by that chip enable signal, and instead may be configured to receive and/or be enabled by a different chip enable signal from the controller 102.

For some example configurations, the chip enable group in which a memory die 104 is configured may depend on a chip on which the memory die 104 is located. That is, physically, the non-volatile memory system 100 may include one or more chips, with each chip including one or more dies. Memory dies 104 located on the same chip may be part of the same chip enable group and configured to receive the same chip enable signal from the controller 102 to be enabled, whereas memory dies 104 located on different chips may be part of different chip enable groups and configured to receive different chip enable signals from the controller 102 to be enabled. For other example configurations, memory dies 104 may be located on the same chip but configured in different chip enable groups.

In addition to being configured in a chip enable group, each of the memory dies 104 may have and/or be assigned a die identification in accordance with a die selection scheme. In order to communicate with (e.g., send a command to and receive responses from) a particular memory die 104 within a chip enable group, the controller 102 may be configured to select or address that particular memory die 104. For some example configurations, the controller 102 may select or address a particular memory die 104 within a chip enable group by issuing a die select command to the chip enable group. The die select command may include the die identification of the memory die 104 with which the controller 102 wants to communicate.

A host and the non-volatile memory system 100 may use different addressing schemes for managing the storage of data. When a host wants to write data to the non-volatile memory system 100, the host may assign a host or a logical address (also referred to as a logical block address (LBA)) to the data. Similarly, when the host wants to read data from the non-volatile memory system 100, the host may identify the data it wants read by the host or logical address. The host may utilize a host or logical addressing scheme under which a host file system maintains a logical address range for all LBAs assigned or recognized by the host. In addition, for some example configurations, the host may address data in units of logical sectors. Accordingly, host read and write requests may be requests to read and write a segment comprising a string of logical sectors of data with contiguous addresses.

In contrast to the host's logical addressing scheme, the non-volatile memory system 100 may store and access data according to a physical addressing scheme that uses physical addresses different from the logical addresses assigned by the host to store and access data. The physical addressing scheme may include at least one set of physical addresses that identifies physical locations in the non-volatile memory dies 104 where data is stored, or is to be stored or retrieved. The at least one set may include a first set of physical addresses that the controller 102 may send to the non-volatile memory 104, which the non-volatile memory dies 104 may then use to store or retrieve data. The physical addresses in the first set may include physical identifiers that identify the physical or structural components of the memory die 104 where data sets associated with those physical addresses are stored, or are to be stored or retrieved. Such physical identifiers may include a chip identification (ID) (e.g., a chip number), a die ID (e.g., a die number), a block ID (e.g., a block number), a wordline ID (e.g., a wordline number), and a plane ID (e.g., a plane number). These physical identifiers may identify a page of storage (e.g., a page of memory cells) within the memory dies 104 where a page of data is stored, or is to be stored or retrieved. The physical identifiers may additionally include a column address offset ID (e.g., an offset number) that identifies a subset of storage (e.g., a subset of memory cells) within the page of storage where a subset of the page of data is stored.

For some example configurations, the physical addressing scheme may include a second set of physical addresses that identifies where in the memory dies 104 data is stored, or is to be stored or retrieved. The second set of physical addresses may include metablock IDs (e.g., metablock numbers). For non-volatile memory systems 100 that use both the first set and the second set of physical address to manage the storage of data, physical addresses in the first set (i.e., those that include the physical identifiers) may be referred to as actual physical addresses, and the physical addresses in the second set (i.e., those that include the metablock numbers) may be referred to as abstract physical addresses.

To coordinate the host's logical addressing scheme with the non-volatile memory system's physical addressing scheme, the non-volatile memory system 100 may perform address translation in which the non-volatile memory system 100 translates a logical address included in a host request to an actual physical address for storage or retrieval of data. For some example implementations, the translation may be a direct translation or involve a single translation in which the logical address is directly translated to the actual physical address. For other example implementations, the translation may involve multiple translations in which the logical address is first translated to an abstract physical address (e.g., a metablock number, a plurality of metablocks, and/or physical sectors within a metablock), and then metablock number is the translated to an actual physical address that includes the physical identifiers.

Figure 5:
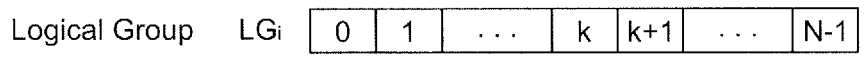
FIG. 5 is a schematic diagram of an example mapping between logical addresses and metablocks.
Figure 5:
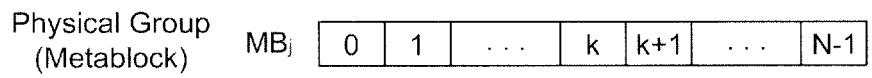
Figure 5:
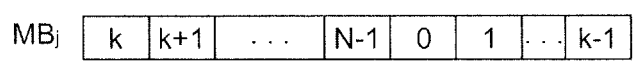

FIG. 5 shows a schematic diagram of an example mapping between logical addresses and metablock numbers (MB). For some example configurations, the logical addresses (LBAs) may be grouped into logical groups (LGs), and the logical groups may be mapped to the metablocks. Each logical group may be mapped to a unique metablock. Accordingly, as shown in FIG. 5, a metablock may have a N-number of physical sectors for storing N-logical sectors of data associated with a logical group. For some example configurations, the logical sectors of data may be stored in the physical sectors in contiguous and sequential logical order 0, 1, . . . , N−1. Alternatively, N logical sectors of data may be stored randomly or discontiguously in N physical sectors of a metablock.

In addition, for some example configurations where data is stored contiguously, there may be an offset between the lowest address of a logical group and the lowest address of the metablock to which it is mapped. In that case, logical sector addresses may wrap around as a loop from the bottom back to the top of the logical group within the metablock. For example, as shown in the bottom diagram of FIG. 5, a metablock MB, may store data associated with a logical sector k in its first physical sector 0. When the last logical sector N−1 is reached, the logical sectors may wrap around such that the first logical sector 0 is stored contiguously and sequentially after logical sector 0, and the logical sector k−1 is stored in the last physical sector N−1. A page tag may be used to identify any offset, such as by identifying the starting logical sector address of the data stored in the first physical of the metablock.

Referring back to FIG. 2A, in order to keep track of where in the non-volatile memory system 100 data is stored and translate logical addresses to physical addresses or vice versa, the non-volatile memory system 100 may maintain or manage an address mapping system 178 that maps relationships or associations between host or logical addresses and physical addresses. The address mapping system 178 may include one or more address data structures (such as tables, listings, logs, or databases as examples) that track and identify the logical-physical address relationships or mappings that the controller 102 may access to determine where in the non-volatile memory system 100 the most recent version of the data is stored. The address mapping system 178 may be stored in the non-volatile memory dies 104, and the controller 102 may read or load portions of the address mapping system 178 into RAM 116 as needed in order to perform a read or write operation.

The address data structures may include a primary address data structure (also referred to as a Group Address Table (GAT)) that provides a primary logical-physical address mapping for logical addresses included in the logical address range recognized by the host. Various configurations of the mapping for the GAT are possible. In one example configuration for flash technology, the GAT keeps track of logical-physical address mapping between logical groups of logical sectors and corresponding metablocks. The GAT includes an entry for each logical group, ordered sequentially according to logical addresses. In addition, the GAT may be organized into a plurality of GAT pages, with each GAT page including entries identifying a metablock address for every logical group. For some example configurations, the address data structures may include at least one secondary address data structure in addition to the GAT. The at least one secondary address data structure may provide logical-physical address mapping for data fragments, may track changes or updates to where data is stored, or some combination thereof. One example secondary address data structure, referred to as GAT Delta, may track changes to entries and/or include a listing of changed entries in the mappings of the GAT. When data is re-written, the new version of the data may be written to another part of the non-volatile memory system 100, such as in an update block. GAT Delta may map data stored in the update blocks with associated logical groups. For some example configurations, GAT Delta may be part of a Master Index Page (MIP) that, in addition to GAT Delta, includes a Free Block List (FBL) and/or the GAT. The Free Block List may be a list that identifies blocks that are available for storage of data (e.g., for allocation as an update block) and that may be later mapped to logical groups. Other secondary address data structures may be possible.

Such primary and secondary address data structures are merely exemplary and other data structures may be possible. For example, other address data structures may directly map logical addresses to actual physical addresses rather than abstract physical addresses. In general, the address mapping system 178 maintained by the non-volatile memory system may include at least one address data structure that associates host logical address information with physical address information.

In the example configuration shown in FIG. 2A, the media management layer 138 may be configured to manage the address mapping system 178 and mapping relationships between the logical addresses and the abstract physical addresses (e.g., metablock numbers). The physical address ID module 172 may be configured to determine an actual physical address using logical address information or abstract physical address information it receives.

Although the non-volatile memory system 100 may utilize both an abstract physical address set and an actual physical address, hereafter, the two sets of physical addresses are not distinguished and the term "physical address" is used to include both abstract physical addresses and actual physical addresses. That is, for clarity, the term "physical address" is used for both mapping to a logical address as for identifying the physical location in a non-volatile memory die 104 where a data set is stored.

Figure 6:
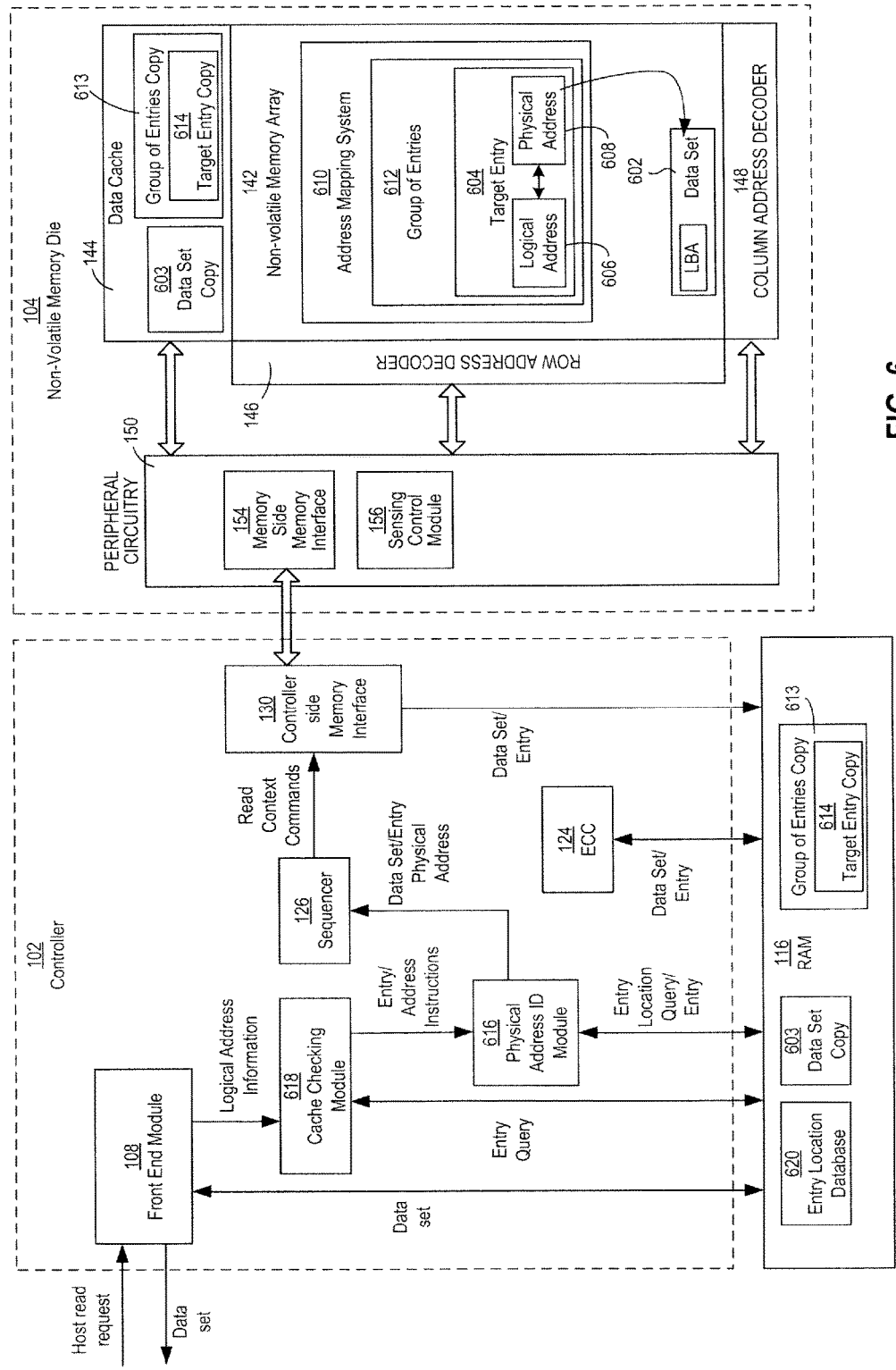
FIG. 6 is a block diagram of modules of the controller and non-volatile memory die of FIGS. 2A and 2B, respectively, that may be involved in a first example read operation to execute a host read request.

FIG. 6 shows a block diagram of modules of the controller 102 and of a non-volatile memory die 104 that may be involved in a first example read operation to execute a host read request. The host read request may be a request or command received by the non-volatile memory system 100 from a host to read a data set 602 that is stored in the non-volatile memory die 142. The read request may identify the data set 602 that the host wants read by including in the request a logical address associated with the data set 602. The logical address may identify, at least to the host, where in the non-volatile memory system 100 the data set 602 is being stored.

In order to execute the host read request, the sensing control module 156 may control the row and column address decoders 146, 148 to perform a sense operation on the data set 602 in order to have a sensed version or copy 603 of the data set 602 sensed into the data cache 144. After being sensed into the data cache 144, the data set copy 603 may be transferred into the RAM 116 via the memory-side and controller-side memory interfaces 154, 130. The ECC module 124 may then perform error correction on the data set copy 603. Assuming that the data set copy 603 passes the error correction, the front end module 108 may retrieve the data set copy 603 from out of the RAM 116 and transfer the data set copy 603 back to the host in order to complete execution of the host read request.

In order for the sensing control module 156 to sense the data set copy 603 into the data cache 144, the sensing control module 156 may need to know the physical address at which the data set 602 is being stored. The controller 102 may determine the data set physical address based on the logical address included in the host read request, and then provide the data set physical address to the sensing control module 156 via the controller-side and memory-side memory interfaces 130, 154.

In order to determine the data set physical address, the controller 102 may determine a logical-physical mapping between the logical address and the data set physical address. The logical-physical mapping may be identified in a target entry 604 that includes a logical address identifier 606 that identifies the logical address and a physical address identifier 608 that identifies the data set physical address.

As shown in FIG. 6, a mapping system 610, which may include all or at least a portion of the mapping system 178 (FIG. 2A), may be stored in the non-volatile memory array 142. The mapping system 610 may include one or more address data structures that include entries mapping logical addresses to physical addresses. Among the entries may include a group of entries 612, one of which may include the target entry 604. For some example configurations, the group of entries 612 may include entries stored in the same page of storage and that may be sensed together in a single sensing operation.

In order for the controller 102 to determine the data set physical address and provide the data set physical address to the sensing control module 156, a copy 614 of the target entry 604 may be loaded into the RAM 116. Once the target entry copy 614 is loaded into the RAM 116, a physical address identification (ID) module 616 of the controller 102 may retrieve the target entry copy 614 and extract the data set physical address identified by the logical-physical mapping.

The physical address ID module 616 may then provide the data set physical address to the sequencer module 126, which in turn may generate read context commands to retrieve the data set 602 located at the data set physical address. In one example configuration, the read context commands may include sense and data transfer commands. The sense command may be used to have the data set copy 603 sensed into the data cache 144. The data transfer command may be used to transfer the data set copy 603 from the data cache 144 to the RAM 116. The sequencer module 126 may provide the sense command to the sensing control module 156 via the controller-side and memory-side memory interfaces 130, 154. The sensing control module 156 may use the data set physical address identified in the sense command to control the row and column address decoders 146, 148 so that the data set copy 603 is sensed into the data cache 144. After sending the sense command, the sequencer module 126 may issue the data transfer command to the memory-side memory interface 154 via the controller-side memory interface 130. In response, the memory-side memory interface 154 may transfer the data set copy 603 to the controller-side memory interface 130, which in turn may store the data set copy 603 in the RAM 116. Issuing a data transfer command to transfer data from the data cache 144 to the RAM 116 may be referred to as toggling.

In some situations, the target entry copy 614 may already be stored in the RAM 116 when the host read request is received. As an example, in some configurations in order to enhance read efficiency, the controller 102 may be configured to identify a high likelihood of receiving the host read request. In response to making such an identification, the controller 102 may store the target entry copy 614 in the RAM 116. This way, when the host read request is received, the logical-physical mapping will already be accessible via the RAM 116, and time may be saved since the controller 102 will not have to go through the process of retrieving the target entry copy 614 from the non-volatile memory array 142. Alternatively, if the target entry copy 614 is not already stored in RAM 116 when the host read request is received, then the controller 102 may retrieve the target entry copy 614 from the non-volatile memory array 142 in order to determine the data set physical address, as described in further detail below.

The controller 102 may include a cache checking module 618 that is configured to determine whether the target entry copy 614 is stored in the RAM 116. When the front end module 108 receives the host read request, the front end module 108 may send logical address information included in the host read request to the cache checking module 618. Upon receipt of the logical address information, the cache checking module 618 may query the RAM 116 to determine if the target entry 614 is in RAM 116. If it is, then the cache checking module 116 may provide the target entry copy 614 to the physical address ID module 616. In turn, the physical address ID module 616 may determine the data set physical address and provide it to the sequencer module 126. The sequencer module 126 may then generate the context commands to have the data set copy 603 loaded into the RAM 116, as previously described.

Alternatively, if the target entry copy 614 is not loaded into the RAM, then the controller 102 will need to know where in the non-volatile memory array 142 the target entry 604 is located. Regardless of whether or not the target entry copy 614 is loaded in the RAM 116 when the host read request is received, the RAM 116 may include an entry location database 620 that identifies (e.g., that includes pointers to) where each of the entries included in the address mapping system 610 are located. If the target entry copy 614 is not in the RAM 116 when the host read request is received, then the cache checking module 618 may instruct the physical address ID module 616 to query the entry location database 620 to determine the location (i.e., the physical address) of the target entry 604 in the non-volatile memory array 142.

In response to receiving the instruction from the cache checking module 618, the physical address ID module 616 may obtain the physical address of the target entry 604 and provide it to the sequencer module 126. In turn, the sequencer module 126 may generate context commands to have the target entry copy 614 sensed out of the memory array 142 and transferred into the RAM 116.

Essentially, the target entry copy 614 is treated as data, and so after the target entry copy 614 is loaded into the RAM 116, the ECC module 124 may perform error correction on the target entry copy 614, flipping bit values that the ECC module 124 identifies as incorrect. Assuming that the target entry copy 614 passes the error correction, the physical address ID module 616 may then access the target entry copy 614 to extract the data set physical address identified in the target entry copy 614. The physical address ID module 616 may then provide the data set physical address to the sequencer module 126 to have the data set copy 603 sensed out of the memory array 142 and transferred to the RAM 116, as previously described.

As mentioned, the target entry 604 may be stored with a group of entries 612 in a page of storage in the memory array 142. During a single sense operation, when the target entry copy 614 is sensed into the data cache 144, copies of the other entries in the page of storage may also be sensed into the data cache 144 as a group of entries copy 613, and the entry group copy 613 may be transferred to the RAM 116. In this way, the target entry copy 614 may be stored in the RAM 116 as part of the entry group copy 613. The ECC module 124 may perform error correction on the entry group copy 613. In addition, when identifying the data set physical address, the physical address ID module 616 may be configured to determine which of the plurality of entries in the group is the target entry copy 614. In one example, the physical address ID module 616 may determine a column address offset, such as by performing a mathematical modulo calculation on the logical address, which may indicate which of the plurality of entries is the target entry copy 614.

In some situations, when a copy of an entry is loaded in the RAM 116, the entry copy may contain bit errors, which may cause the physical address ID module 616 to identify a wrong data set physical address, which in turn may lead to the wrong data set being sensed out of the memory array 142 and transferred into the RAM 116. In order to ensure that the correct data set is sensed out of the memory array 142 and loaded into the RAM 116, error correction may be performed on the target entry copy 614.

However, in many other situations, when a copy of an entry is loaded into the RAM 116, it will not contain errors, or at least an insufficient number of errors, such that the physical address ID module 616 will still identify the correct data set physical address even if error correction is not first performed on the target entry copy 614. As such, for these other situations, it is not necessary for the ECC module 124 to perform error correction on the target entry copy 614.

From a read efficiency perspective, it may be advantageous to transfer data set copies from the memory array 142 to the RAM 116 without first performing error correction on the entry copies. After a data set copy is transferred into the RAM 116, a check or verification process may be performed to determine if the data set copy in the RAM is indeed the one that the host read request requested to be read. If not, then error correction may be performed on the entry copy in order for the correct data set copy to be transferred to the RAM 116. If the number of entries not needing error correction is sufficiently large, then the overall read efficiency of the non-volatile memory system 100 in responding to host read requests may be improved, compared to configurations where error correction is performed on every entry sensed out of the memory array 142.

Figure 7:
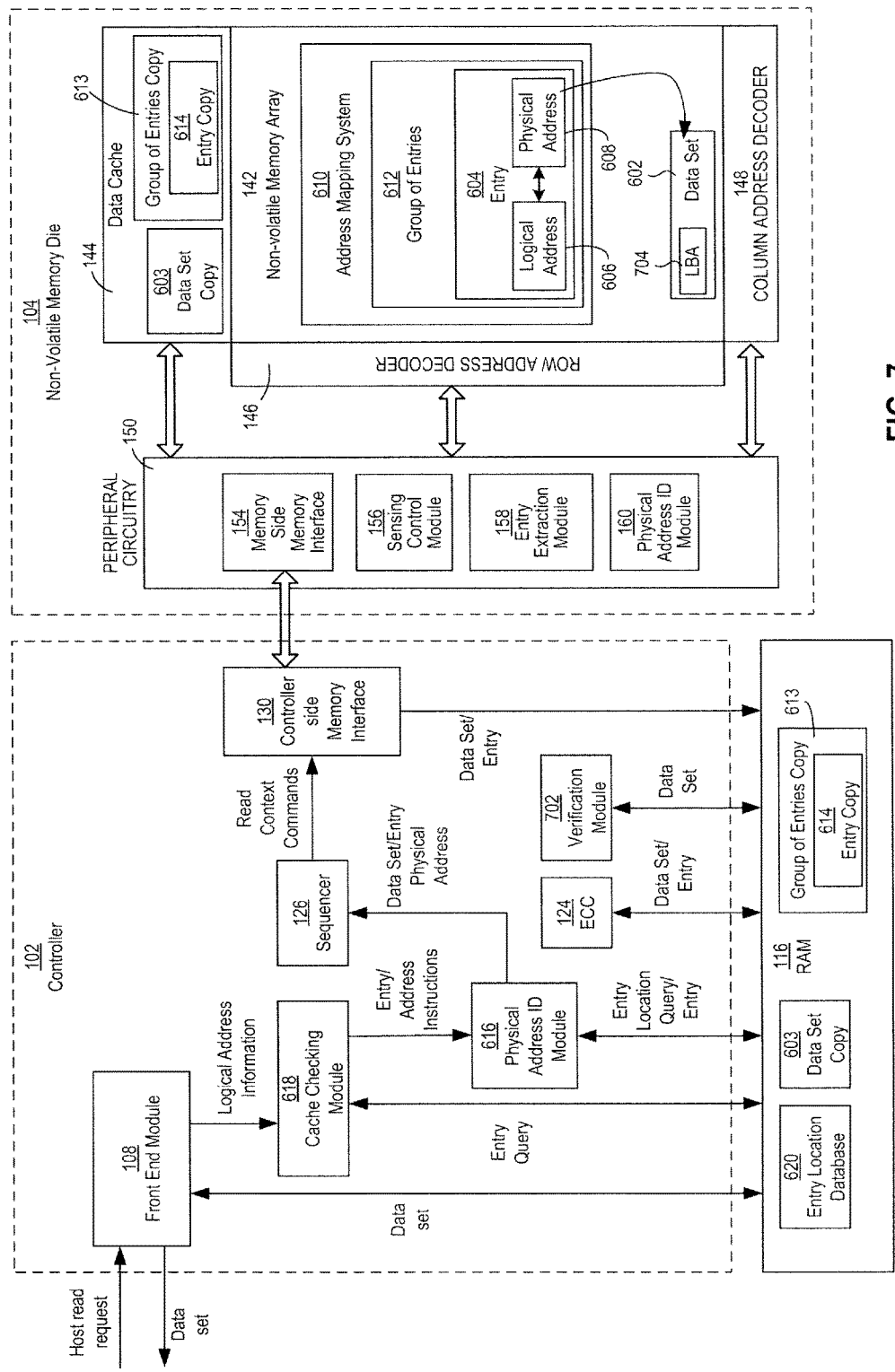
FIG. 7 is a block diagram of modules of the controller and non-volatile memory die of FIGS. 2A and 2B, respectively, that may be involved in a second example read operation to execute a host read request.

FIG. 7 shows a block diagram of modules of the controller 102 and of a non-volatile memory die 104 that may be involved in a second example read operation to execute the host read request requesting the data set 602 to be read from the memory array 142. In the second example read operation, if the target entry copy 614 is already loaded into the RAM 116, then the data set copy 603 may be sensed out of the memory array 142 and transferred to the RAM 116 as described above in the first example read operation with reference to FIG. 6. However, if the target entry copy 614 is not already stored in the RAM 116 when the host read request is received, then the data set copy 603 may be transferred from the memory array 142 to the RAM 116 without first transferring the target entry copy 614 to the RAM 116 and performing error correction on the target entry copy 614.

When the host read request is received, the cache checking module 618 may check the RAM 116 to determine whether the target entry copy 614 is stored in the RAM 116. If it is, then the physical address ID module 616 may determine the data set physical address identified in the target entry copy 614 and provide the data set physical address to the sequencer module 126. The sequence module 126 may then generate context commands to have the data set copy 603 sensed and transferred into the RAM 116, as performed in the first example read operation described with reference to FIG. 6.

Alternatively, if the target entry copy 614 is not in the RAM 116, then the physical address ID module 616 may query the entry location database 620 to determine the entry physical address of the target entry 604. Upon determining the entry physical address, the physical address ID module 616 may provide the entry physical address to the sequencer module 126.

In response to receipt of the entry physical address, the sequencer module 126 may generate a sense command to have the target entry copy 614 sensed into the data cache 144. As previously described, the target entry 604 may be stored along with a group of entries 612 in a page of storage, and a single sense operation may be performed on the entry group 612 in order to sense the entry group copy 613, including the target entry copy 614, into the data cache 144.

In order for the sensing control module 156 to sense the entry group copy into the data cache 144, the physical address included in the sense context command may include physical identifiers that identify the physical location of the group of entries 612 in the memory array 142. Example physical identifiers may include a chip ID, a die ID, a block ID, a wordline ID, and a plane ID. The sensing control module 156 may use these physical identifiers in order to control the row and column address decoders 146, 148 to perform a sensing operation on the group of entries 612.

When the entry group copy 613 is sensed into the data cache 144, rather than transfer the entry group copy 613 to the RAM 116 as performed in the first example read operation, the entry extraction module 158 may instead extract the target entry copy 614 from the entry group copy 613, and provide the target entry copy 614 to a physical address ID module 160 located on the die 104. In order for the entry extraction module 158 to determine which entry of the plurality of entries in the group is the target entry copy 614, the sequencer module 126 may provide the entry extraction module 158 with a column address offset. In some example configurations, the physical address used to sense the entry group copy 613 and the column address offset used to extract the target entry copy 614 from the entry group copy 613 may be sent from the controller 102 to the die 104 together in a single context command. In other example configurations, the physical address and the column address offset may be sent from the controller 102 to the die 104 separately. In at least some configurations, transferring the physical address and the column address offset together in a single context command may be more desirable since doing so may require a lower amount of clock cycles than when transferring them separately.

When the physical address ID module 160 located on the die 104 receives the target entry copy 614 from the entry extraction module 158, the physical address ID module 160 may determine the data set physical address from the target entry copy 614 and provide the data set physical address to the sensing control module 156. In turn, the sensing control module 156 may use the data set physical address to perform a sense operation on the data set 602 in order to have the data set copy 603 sensed into the data cache 144.

After the data set copy 603 is loaded into the data cache 144, it may then be transferred to the RAM 116. In some example configurations, when the data set copy 603 is sensed into the data cache 144, the sequencer module 126 of the controller 102 may issue a data transfer command to have the data set copy 603 transferred to the RAM 116. In this way, the sequencer module 126 may generate a pair of context commands in response to receipt of the target entry physical address from the physical address ID module 616—a sense command to have a sense operation performed on the target entry 604 and a data transfer command to retrieve the data set copy 603 and have it loaded into the RAM 116. This is in contrast to the first example read operation to execute the host read request in which the sequencer module 126 may generate two pairs of sense and data transfer command—a first pair to sense and have transferred the target entry copy 614, and a second pair to sense and have transferred the data set copy 602.

Other ways of transferring the data set copy 603 from the data cache 114 to the RAM 116 may be possible. For example, once the data set copy 603 is loaded into the data cache 144, the memory-side memory interface 154 may transfer the data set copy 603 to the controller 102 without being prompted to do so by receipt of a data transfer command.

Regardless of the communication between the controller 102 and the die 104 for transfer of the data set copy 603 to the RAM 116, in the second example read operation to execute the host read request, the target entry copy 614, despite not being stored in the RAM 116 when the host read request is received, is not sent back to the controller 102 before and/or in order for the data set copy 603 to be sent from the die 104 to the controller 102 and loaded into the RAM 116. In addition, since the target entry copy 614 is not sent back to the controller 102, error correction is not performed by the ECC module 124 on the target entry copy 614. As a result, consumption of resources and time needed to execute the host read request under the second example read operation compared the first example read operation, due to fewer commands and data being communicated between the controller 102 and the die 104 in addition to error correction not being performed on the target entry copy 614, may be reduced.

In another example read operation to execute the host read request, the target entry copy 614 may still be transferred back to the controller 102 and loaded in the RAM 116. However, the ECC module 124 may not perform error correction on the target entry copy 614 before the physical address ID module 616 provides the data set physical address to the sequencer module 126. In this way, even though the target entry copy 614 is sent back to the controller 102, time and resources may be still be saved by foregoing error correction on the target entry copy 614 before retrieving the data set copy 603.

In some situations, the target entry copy 614 may include errors in one or more bit values, which in turn may cause the target entry copy 614 to identify a physical location of a data set that is different than the data set that the host read request wants read. The wrong data set may be sensed out of the memory array 142 and transferred to the RAM 116 as a result. Performing error correction on the target entry copy 614 before the physical address ID module 616 determines the data set physical address may correct the errors in the target entry copy 614, which in turn may cause the physical address ID module 616 to identify the correct data set physical address and allow the correct data set to be transferred from the die 104 to the RAM 116, and ultimately sent back to the host.

In the second example read operation, since error correction may not be performed on the target entry copy 614 before obtaining the data set copy 603, errors in the target entry copy 614 may cause an incorrect data set to be copied into the RAM 116. In order to ensure that the controller 102 does not send the wrong data back to the host, the controller 102 may include a verification module 702 that is configured to verify whether the data set copy 603 is the correct data set that the host read request requested to be read. FIG. 7 shows the verification module 702 as being separate from the ECC module 124, although in other configurations, the verification module 702 may be part of the ECC module 124.

If the verification module 702 determines that the data set copy 603 is the correct data set, then the front end module 108 may retrieve the data set copy 603 from the RAM 116 and send the data set copy 603 to the host in order to complete the execution of the host read request. Alternatively, if the verification module 702 determines that the data set copy 603 is not the correct data set, then the modules of the controller 102 and the memory die 104 shown in FIG. 6 may be used to re-execute the host read request, but in accordance with the first example read operation rather than the second example read operation. That is, the physical address 1D module 616 may again retrieve the physical address of the target entry 604 by querying the entry location database 620, and the sequencer module 126 may issue a pair of context commands in order to have a sense operation performed on the target entry 604 and the target entry copy 614 transferred into the RAM 116. The ECC module 124 may then perform error correction on the target entry copy 614, which will ensure that the physical address ID module 616 identifies the correct data set physical address and that the correct data set is copied into the RAM 116.

The verification module 702 may perform verification by performing a comparison of logical address information. As shown in FIG. 7, the data set 602 stored in the memory array 142 may include a logical address identifier (LBA) 704 that identifies the logical address with which the data set 602 is associated. The logical address identifier 704 may be part of a header of the data set 602, although other ways of including the logical address identifier 704 as part of the data set 602 may be possible.

When the data set copy 603 is sensed into the data cache 144 and then transferred to the RAM 116, a copy of the logical address identifier 704 may be included as part of the data set copy 603. The ECC module 124 may perform error correction on the data set copy 603, correcting any bit errors. Assuming that the data set copy 603 passes error correction, the verification module 702 may then verify whether the data set copy 603 is correct (e.g., matches the data set that the host read request requested to be read) by extracting the logical address information included in the data set copy 603 and comparing it with the logical address information that was included in the initial host read request.

If the logical address information from the data set copy 603 matches the logical address information that was included in the host read request, then the verification module 702 may determine that the data set copy 603 is correct. After the verification module 702 makes the verification, the front end module 108 may access the data set copy 603 in the RAM 116 and transfer it to the host to complete execution of the host read request.

Alternatively, if the logical address information from the data set copy 603 does not match the logical address information that was included in the host read request, then the verification module 702 may determine that the data set copy 603 is incorrect. In response, the front end module 108 may not send the data set copy 603 to the host. Instead, the host read request may be re-executed under the first execution, in which the target entry copy 614 is transferred from the die 104 to the controller 102 so that the ECC module 124 can perform error correction on the target entry copy 614 and the correct data set can be retrieved from the die 104.

In most cases, the target entry copy 614 that is sensed will not contain bit errors (or at least an insufficient amount of bit errors) such that the verification module 702 will determine a match between the two sets of logical address information and the correct data set will be sent back to the host without the controller 102 and the memory die 104 having to re-execute the host read request. As such, overall or on average, read performance of the non-volatile memory system 100 may be improved since the overall savings in time and resources due to reducing the amount of communication between the controller 102 and the memory die 104 and/or the elimination of error correction on the entry copies may outweigh the small number of times that a host read request needs to be re-executed.

Figure 11:
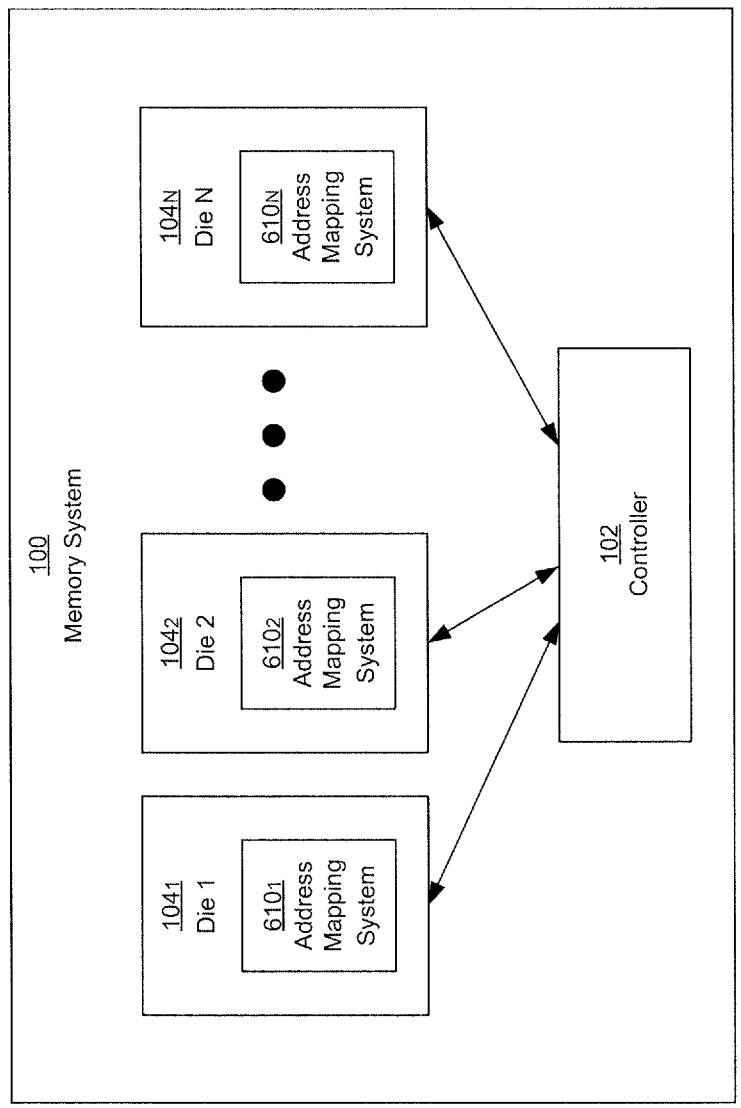
FIG. 11 shows an example multi-die configuration of the memory system shown in any of FIGS. 1A-1C.

The second example read operation to execute the host read request may be performed when the data set 602 and the target entry 604 identifying where the data set 602 is stored are located on the same memory die 104. FIG. 11 shows an example multi-die configuration of the memory system 100 that includes an N-number of dies (N being an integer greater than one). As shown in FIG. 11, each memory die $104_1, 104_2 \ldots 104_N$ may store a respective address mapping system $610_1, 610_2, \ldots 610_N$. Each respective mapping system 610 may identify where data sets are stored on that particular die 104. Collectively, the address mapping systems $610_1, 610_2, \ldots 610_N$ may form the address mapping system 178 shown in FIG. 2A. In some configurations, an entry of an address mapping system 610 stored on one die 104 may identify a physical address of a different die—i.e., that a data set corresponding to the physical address is stored on a different die. For example, on a particular die 104, when the physical address ID module 160 identifies a physical address in the target entry copy 614, the physical address may identify that the corresponding data set is stored on a different die. For these situations, the sensing control module 156 may not perform a sensing operation since the corresponding data set is stored on the different die. Instead, the memory-side memory interface 154 may return the physical address identified in the target entry copy 614 back to the controller 102 so that the controller 102 can retrieve the data set stored on the different die 104.

Figure 8:
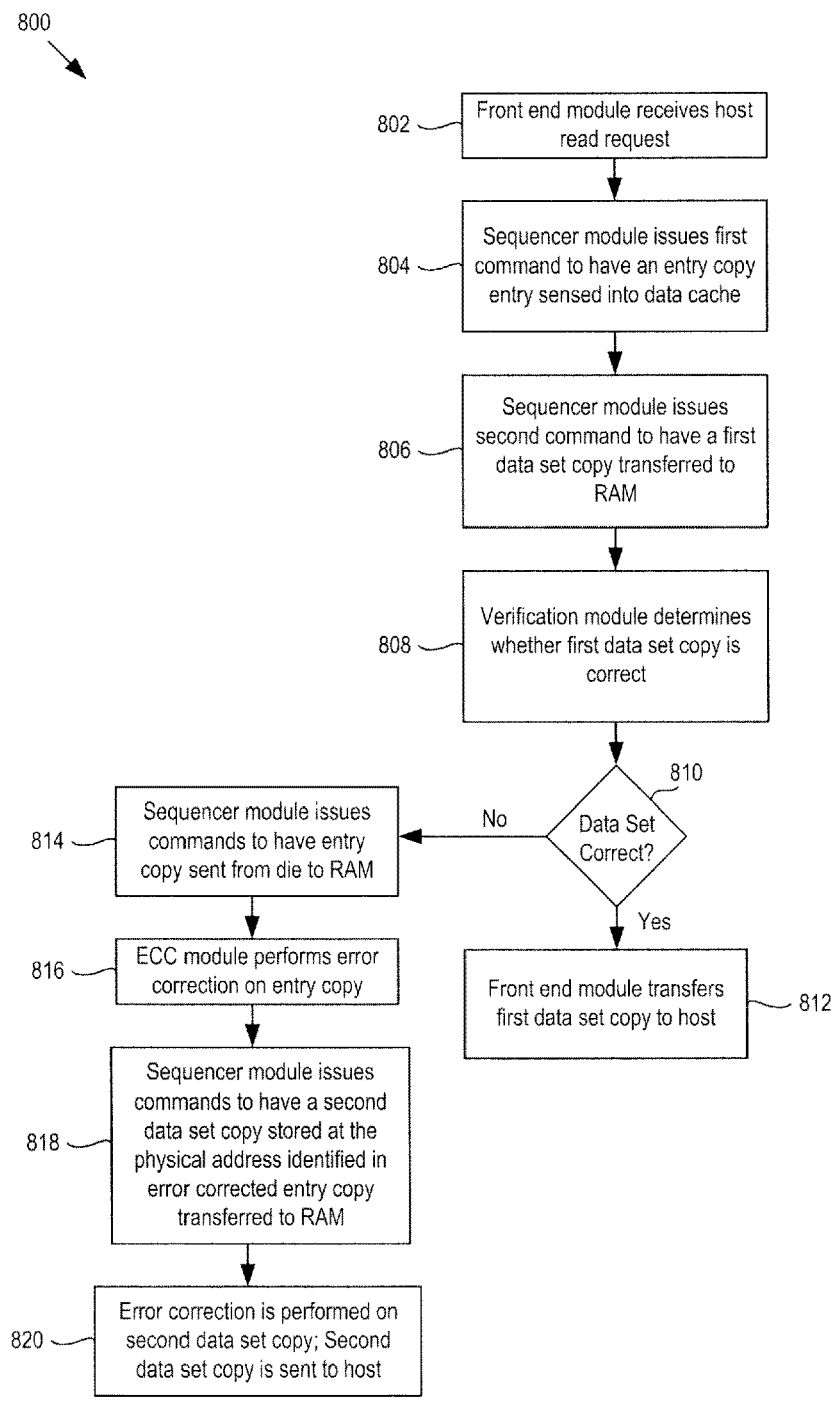
FIG. 8 is a flow chart of an example method of performing a read operation with a non-volatile memory system.

FIG. 8 shows a flow chart of an example method 800 of performing a read operation with a non-volatile memory system. At block 802, a front end module of a controller of the non-volatile memory system may receive a host read request from a host. The host read request may include a logical address associated with a requested data set that the host wants read. A non-volatile memory array of a non-volatile memory die of the non-volatile memory system may store the requested data set at a correct physical address. The non-volatile memory array may also store a target mapping entry that maps the logical address to a physical address. The target mapping entry may be stored in the memory array at an entry physical address. In some situations, the physical address in the target mapping entry may be a correct physical address such that when a copy of the target mapping entry is sensed and then copied into RAM external the memory die, the physical address correctly identifies where in the non-volatile memory array the requested data set is stored, even before or regardless of whether error correction is performed on the target mapping entry copy. In other situations, the physical address in the target mapping entry may be an incorrect physical address such that when a copy of the target mapping entry is sensed and then copied to the RAM, the physical address does not correctly identify where in the non-volatile memory array the requested data set is stored. In these other situations, error correction performed on the target mapping entry copy in the RAM may change the physical address from an incorrect physical address to a correct physical address.

At block 804, a sequencer module of the controller may issue a first command to have the memory die sense a copy of the target mapping entry into a data cache of the memory die. The memory die may load a copy of a first data set into the data cache when it receives the first command. The first data set may be stored at a physical address identified in the copy of the target mapping entry sensed into the data cache. At block 806, the sequencer module may issue a second command to have the first data set copy transferred from the data cache to the RAM. The first data set copy may be transferred from the data cache to the RAM when the second command is issued.

At block 808, a verification module of the controller may determine whether the first data set copy in the RAM is correct (e.g., that it matches the requested data set). The verification module may make the determination by comparing a logical address included in the first data set copy in the RAM with the logical address included in the host read request. If the logical addresses match, then the verification module may determine that the first data set copy in the RAM is correct. If they do not match, then the verification module may determine that the first data set copy in the RAM is not correct.

At block 810, if the first data set copy is correct, then at block 812, the front end module may transfer the first data set copy in the RAM to the host to complete performance of the read operation. Alternatively, if at block 810, the first data set copy is incorrect, then at block 814, the sequencer module may reissue the first command that it issued at block 804 to have the memory die sense a copy of the target mapping entry into the data cache. In addition, at block 814, the sequencer module may issue another command to have the target mapping entry copy transferred to the RAM. At block 816, when the target mapping entry copy is in the RAM, an ECC module of the controller may perform error correction on the target mapping entry copy. Performing the error correction may change or flip logic values of one or more bits of the target mapping entry copy such that the physical address identified in the error corrected version of the target mapping entry copy is the correct physical address.

At block 818, the sequencer module may issue commands to have a copy of a second data set stored at the correct physical address identified in the error corrected target mapping entry copy sensed into the data cache and transferred to the RAM. Since the physical address identified in the error corrected target mapping entry copy is the correct physical address, the second data set copy transferred to the RAM at block 818 may match the requested data set. At block 820, error correction may be performed by the FCC module on the second data set copy and, the second data set copy may then be transferred to the host to complete execution of the host read request.

Figure 9:
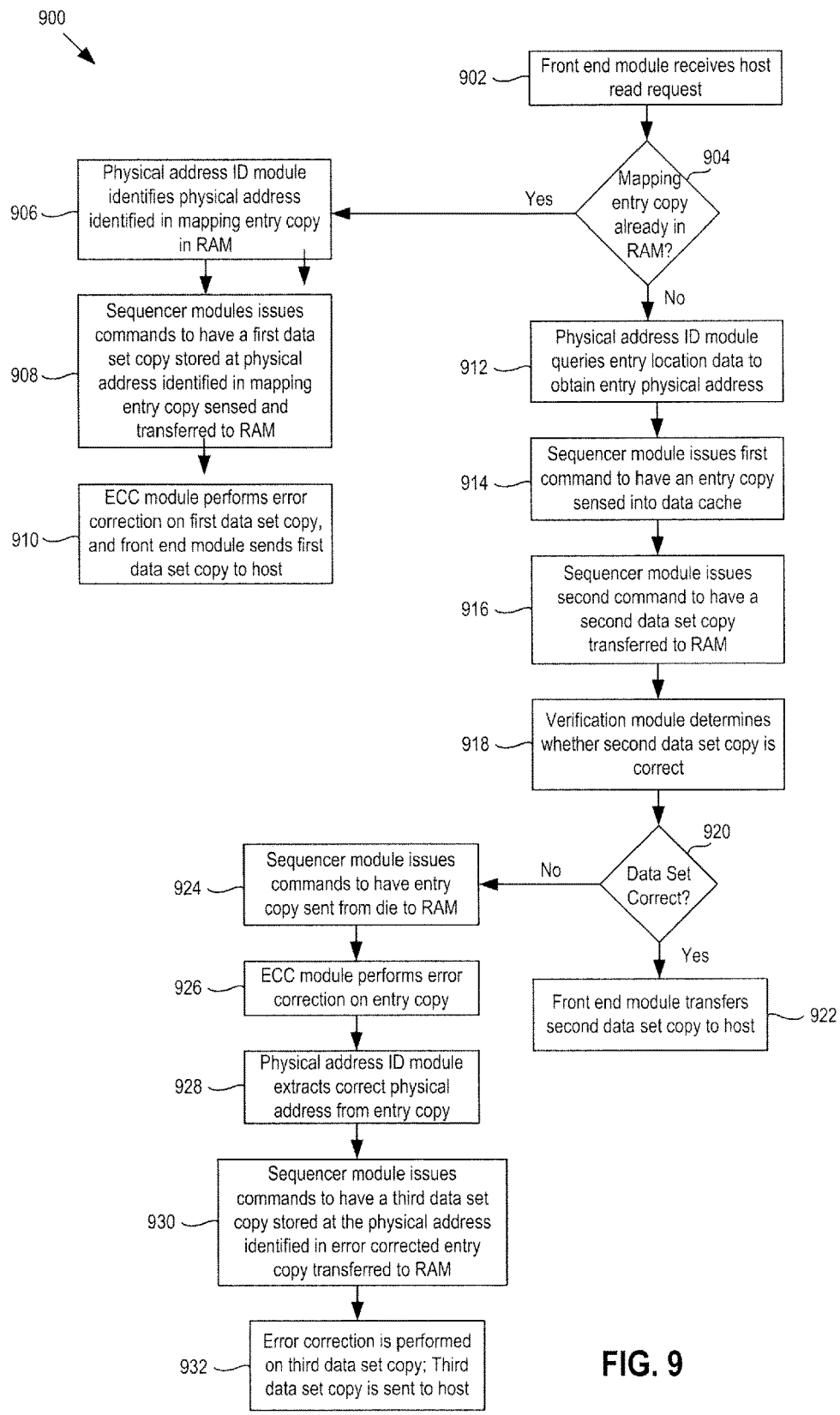
FIG. 9 is a flow chart of another example method of performing a read operation with a non-volatile memory system.

FIG. 9 shows a flow chart of another example method 900 of performing a read operation with a non-volatile memory system. At block 902, a front end module of a controller of the non-volatile memory system may receive a host read request from a host. The host read request may include a logical address associated with a requested data set that the host wants read. A non-volatile memory array of a non-volatile memory die of the non-volatile memory system may store the requested data set at a correct physical address. The non-volatile memory array may also store a target mapping entry that maps the logical address to a physical address. The target mapping entry may be stored in the memory array at an entry physical address. In some situations, the physical address in the target mapping entry may be a correct physical address such that when a copy of the target mapping entry is sensed and then copied into RAM external the memory die, the physical address correctly identifies where in the non-volatile memory array the requested data set is stored, even before or regardless of whether error correction is performed on the target mapping entry copy. In other situations, the physical address in the target mapping entry may be an incorrect physical address such that when a copy of the target mapping entry is sensed and then copied to the RAM, the physical address does not correctly identify where in the non-volatile memory array the requested data set is stored. In these other situations, error correction performed on the target mapping entry copy in the RAM may change the physical address from an incorrect physical address to a correct physical address.

At block 904, a cache checking module of the controller may determine whether a copy of the target mapping entry identifying the logical address is already stored in the RAM. If so, then at block 906, a physical address ID module of the controller may identify a physical address identified in the target mapping entry copy in the RAM and provide the physical address to a sequencer module. At block 908 the sequencer module may issue commands to have a copy of a first data set stored in the memory array at the physical address identified in the target mapping entry sensed and transferred to the RAM. Since the target mapping entry copy was already stored in the RAM, it may have been subjected to error correction. As such, the first data set copy in the RAM at block 908 may match the requested data set. At block 910, error correction may be performed on the first data set copy, and assuming the first data set copy passes error correction, the front end module may transfer the first data set copy from the RAM to the host to complete execution of the host read request.

Referring back to block 904, if the cache checking module determines that a copy of the target mapping entry is not already stored in the RAM, then at block 912, the physical address ID module may query an entry location database with the logical address included in the host read request to obtain the target mapping entry physical address. The physical address ID module may then provide the target mapping entry physical address to the sequencer module.

At block 914, the sequencer module may issue a first command to have the memory die sense a copy of the target mapping entry stored at the entry physical address into a data cache of the memory die. In response, the memory die may sense the target mapping entry copy into the data cache. In addition, the memory die may sense a copy of a second data set into the data cache when it receives the first command. The second data set may be stored at a physical address identified in the target mapping entry copy sensed into the data cache. At block 916, the sequencer module may issue a second command to have the second data set copy transferred from the data cache to the RAM. The second data set copy may be transferred from the data cache to the RAM when the second command is issued.

At block 918, a verification module of the controller may determine whether the second data set copy in the RAM is correct (e.g., that it matches the requested data set). The verification module may make the determination by comparing a logical address included in the second data set copy in the RAM with the logical address included in the host read request. If the logical addresses match, then the verification module may determine that the second data set copy in the RAM is correct. If they do not match, then the verification module may determine that the second data set copy in the RAM is not correct. In some example methods, error correction may be performed on the second set copy before the verification module determines whether the second set copy is correct.

At block 920, if the second data set copy is correct, then at block 922, the front end module may transfer the second data set copy in the RAM to the host to complete performance of the read operation. Alternatively, if at block 920, the second data set copy is incorrect, then at block 924, the sequencer module may reissue the first command that it issued at block 914 to have the memory die sense a copy of the target mapping entry into the data cache. In addition, at block 924, the sequencer module may issue another command to have the target mapping entry copy transferred to the RAM. At block 926, when the target mapping entry copy is in the RAM, an ECC module of the controller may perform error correction on the target mapping entry copy. Performing the error correction may change or flip logic values of one or more bits of the target mapping entry copy such that the physical address identified in the error corrected version of the target mapping entry copy is the correct physical address.

At block 928, after error correction is performed on the target mapping entry copy, the physical address ID module may extract the correct physical address from the error corrected target mapping entry copy and provide the correct physical address to the sequencer module. At block 930, the sequencer module may issue commands to have a copy of a third data set stored at the correct physical address identified in the error corrected target mapping entry copy sensed into the data cache and transferred to the RAM. Since the physical address identified in the error corrected target mapping entry copy is the correct physical address, the third data set copy transferred to the RAM at block 930 may match the requested data set. At block 932, error correction may be performed by the ECC module on the third data set copy and, the third data set copy may then be transferred to the host to complete the read operation to execute the host read request.

Figure 10:
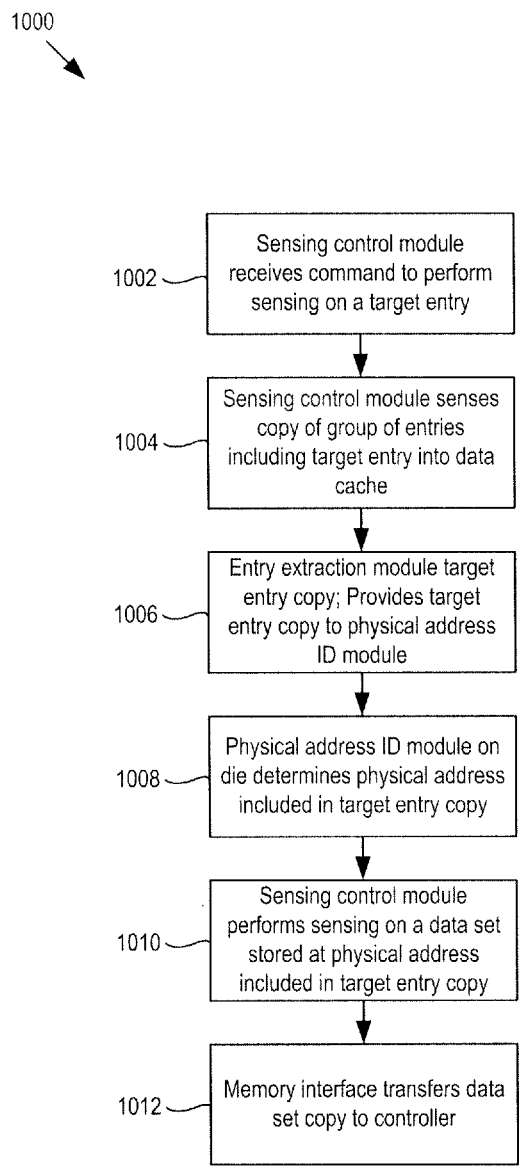
FIG. 10 is a flow chart of a third example method of performing a read operation with a non-volatile memory system.

FIG. 10 shows a flow chart of another example method 1000 of performing a read operation with a non-volatile memory system. The read operation may be performed to execute a host read request that the non-volatile memory system receives from a host. At block 1002, a sensing control module of a non-volatile memory die of the non-volatile memory system may receive a command to performing a sensing operation on a target mapping entry stored at an entry physical address in a non-volatile memory array of the memory die. The command may identify the entry physical address, which may include physical identifiers that the sensing control module may use to perform the sensing operation on the target mapping entry. In some example methods, the physical identifiers may identify a group of mapping entries, one of which may include the target mapping entry. The physical identifiers may identify a storage location, such as a page of storage, where the group of mapping entries is stored. In addition, the command may be received from a controller of the non-volatile memory system in communication with the memory die. The controller may be responsible for communicating with a host and performing error correction on data that the controller receives from the memory die.

At block 1004, the sensing control module may control row and column address decoders to perform a sense operation on the target mapping entry to have a copy of the target mapping entry sensed into data cache of the memory die. In some example methods, when the sense operation is performed on the target mapping entry, the sense operation is also performed on the entire group of mapping entries such that a copy of the group of mapping entries is sensed into the data cache.

At block 1006, an entry extraction module may identify the copy of the target entry among the entries in the mapping entry group copy in the data cache. To do so, the entry extraction module may receive a column address offset ID that identifies which of the mapping entry copies in the group is the target entry copy. The column address offset ID may identify the target entry by identifying a position of the target copy in the group relative to the other entry copies. In some methods, the column address offset ID may be received together with the physical address in the command at block 1002. In other methods, the column address offset ID may be received separate from the column address offset ID in separate commands. After identifying the target entry copy, the entry extraction module may provide the target entry copy to a physical address ID module located on the memory die.

At block 1008, the physical address ID module located on the die may determine the physical address identified in the target entry copy and provide the physical address to the sensing control module. At block 1010, the sensing control module may perform a sensing operation on a data set stored in the memory array at the physical address identified in the target entry copy. A copy of the data set may be sensed into the data cache as a result of the sense operation. At block 1012, a memory interface of the memory die may transfer the data set copy to from the data cache to the controller. In some example methods, the memory interface may transfer the data set copy to the controller in response to receiving a data transfer command from the controller. In addition, the data set copy may be transferred to the controller without error correction being performed on the memory die. The controller may store the data set copy in RAM, and further transfer the data set copy to a host to complete execution of the host read request.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements, located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A non-volatile memory system comprising:
   a non-volatile memory die comprising a non-volatile memory array; and
   a controller configured to:
      receive a host read request to read a data set;
      receive a first physical address of an entry stored in the non-volatile memory array, the entry including a second physical address that identifies where in the non-volatile memory array the data set is stored; and
      upon receipt of the first physical address, generate and issue, to the non-volatile memory die via a memory interface:
         a first command to have the non-volatile memory die perform a sense operation on a memory location having the first physical address where the entry is stored, and
         a second command to have the non-volatile memory die return a data set copy of the data set stored at the second physical address in the non-volatile memory die to the controller.

2. The non-volatile memory system of claim 1, wherein the controller is further configured to determine that the entry is not stored in an external memory that is external to the non-volatile memory die before the controller generates and issues the first command.

3. The non-volatile memory system of claim 2, wherein the controller is further configured to query an entry location database in the external memory to identify the first physical address when the controller determines that the entry is not stored in the external memory upon receipt of the host read request.

4. The non-volatile memory system of claim 1, wherein the controller is further configured to, after the data set copy of the data set is returned to the controller, verify that the data set copy is correct prior to transfer of the data set copy to a host.

5. The non-volatile memory system of claim 4, wherein the controller is further configured to compare a first logical address included in the data set copy of the data set with a second logical address included in the host read request to verify that the data set copy is correct.

6. The non-volatile memory system of claim 5, wherein the controller is further configured to:
   transfer the data set copy to the host when the controller determines that the data set copy is correct, and
   issue at least one third command to have the non-volatile memory die return a copy of the entry to the controller when the controller determines that the data set copy is incorrect.

7. The non-volatile memory system of claim 6, wherein the controller is further configured to:
   perform error correction on the entry copy after the entry copy is returned to the controller, and
   issue at least one fourth command to the non-volatile memory die to have a copy of a third data set returned from the non-volatile memory die to the controller, the third data set stored in the non-volatile memory array at a third physical address identified in the error-corrected entry copy.

8. The non-volatile memory system of claim 4, wherein the controller is further configured to perform error correction on the data set copy before the controller verifies that the data set copy is correct.

9. A non-volatile memory system comprising:
   a controller; and
   a non-volatile memory die comprising:
      a non-volatile memory array;
      a memory interface in communication with the controller and configured to receive a command from the controller to perform a sensing operation on a target entry stored in the non-volatile memory array at a first physical address, wherein the target entry includes a second physical address that identifies where in the non-volatile memory array a data set is stored;
      a sensing control circuit configured to sense a copy of the target entry into a data cache in response to receipt of the command; and a physical address identification circuit configured to identify the second physical address from the target entry copy and provide the second physical address to the sensing control circuit, wherein the sensing control circuit is further configured to sense a copy of the data set into the data cache in response to receipt of the second physical address from the physical address identification circuit, and wherein the memory interface is configured to transfer the data set copy to the controller.

10. The non-volatile memory system of claim 9, wherein the command identifies a group of entries on which to perform the sensing operation, wherein the sensing control circuit is configured to sense a copy of the group of entries into the data cache when sensing the target entry copy into the data cache, wherein the non-volatile memory die further comprises an entry extraction circuit configured to extract the target entry copy from the group of entries copy, and provide the target entry copy to the physical address identification module.

11. The non-volatile memory system of claim 10, wherein the entry extraction circuit is configured to extract the target entry copy from the group using a column address offset.

12. The non-volatile memory system of claim 9, wherein the command comprises a first command, and wherein the memory interface is configured to transfer the data set copy to the controller in response to receipt of a second command from the controller.

13. The non-volatile memory system of claim 9, wherein the memory interface sends the second physical address to the controller when the second physical address identifies that the data set is stored in a different non-volatile memory die.

14. A non-volatile memory system comprising:
a non-volatile memory die comprising a non-volatile memory array;
means for receiving a host read request to read a data set;
means for receiving a first physical address of an entry stored in the non-volatile memory array, the entry including a second physical address that identifies where in the non-volatile memory array the first data set is stored; and
means for issuing a first command and a second command in response to the means for receiving the first physical address, the first command to have the non-volatile memory die perform a sense operation on a memory location having the first physical address where the entry is stored, and the second command to have the non-volatile memory die return a data set copy of the data set stored at the second physical address in the non-volatile memory die.

15. The non-volatile memory system of claim 14, further comprising:
means for determining that the entry is not stored in an external memory that is external to the non-volatile memory die before the means for issuing issues the first command.

16. The non-volatile memory system of claim 15, further comprising:
means for identifying the first physical address; and
means for providing the first physical address to the means for issuing when the means for determining determines that the entry is not stored in the external memory upon receipt of the host read request.

17. The non-volatile memory system of claim 14, further comprising:
means for verifying that the data set copy is correct prior to transfer of the data set copy to a host after the data set copy is returned.

18. The non-volatile memory system of claim 17, further comprising:
means for comparing a first logical address included in the data set copy with a second logical address included in the host read request to verify that the data set copy is correct.

19. The non-volatile memory system of claim 18, further comprising:
means for transferring the data set copy to the host when the means for determining determines that the data set copy is correct; and
means for issuing at least one third command to have the non-volatile memory die return a copy of the entry when the means for determining determines that the data set copy is incorrect.

20. The non-volatile memory system of claim 17, further comprising:
means for performing error correction on the data set copy before the means for verifying verifies that the data set copy is correct.

* * * * *